(12) United States Patent
Lin et al.

(10) Patent No.: US 9,287,203 B2
(45) Date of Patent: Mar. 15, 2016

(54) PACKAGE-ON-PACKAGE STRUCTURE AND METHOD OF FORMING SAME

(71) Applicant: Taiwan Semiconductor Manufacturing Company, Ltd., Hsin-Chu (TW)

(72) Inventors: Chih-Wei Lin, Xinfeng Township (TW); Wen-Hsiung Lu, Jhonghe (TW); Hsuan-Ting Kuo, Taichung (TW); Wei-Yu Chen, Taipei (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 198 days.

(21) Appl. No.: 13/901,084

(22) Filed: May 23, 2013

(65) Prior Publication Data

US 2014/0264842 A1 Sep. 18, 2014

Related U.S. Application Data

(60) Provisional application No. 61/793,543, filed on Mar. 15, 2013.

(51) Int. Cl.
*H01L 23/498* (2006.01)
*H01L 25/10* (2006.01)
(Continued)

(52) U.S. Cl.
CPC ........ *H01L 23/49816* (2013.01); *H01L 21/568* (2013.01); *H01L 24/19* (2013.01); *H01L 24/20* (2013.01); *H01L 24/97* (2013.01); *H01L 25/105* (2013.01); *H01L 24/10* (2013.01); *H01L 24/11* (2013.01); *H01L 24/12* (2013.01); *H01L 24/13* (2013.01); *H01L 24/14* (2013.01); *H01L 24/15* (2013.01); *H01L 24/16* (2013.01); *H01L 24/17* (2013.01); *H01L 24/32* (2013.01); *H01L 24/48* (2013.01); *H01L 24/73* (2013.01); *H01L 2224/32145* (2013.01); *H01L 2224/32225* (2013.01); *H01L 2224/73265* (2013.01); *H01L 2224/97* (2013.01); *H01L 2225/0651* (2013.01); *H01L 2225/1035* (2013.01);
(Continued)

(58) Field of Classification Search
CPC ..................................................... H01L 23/498
See application file for complete search history.

(56) References Cited

U.S. PATENT DOCUMENTS

2008/0080111 A1* 4/2008 Lin et al. .......................... 361/56
2008/0284001 A1* 11/2008 Mori et al. ..................... 257/712
(Continued)

FOREIGN PATENT DOCUMENTS

| KR | 20100095268 A | 10/1993 |
|---|---|---|
| KR | 1020130008666 A | 1/2013 |

*Primary Examiner* — William Harriston
(74) *Attorney, Agent, or Firm* — Slater & Matsil, L.L.P.

(57) ABSTRACT

A device comprises a bottom package comprising interconnect structures, first bumps on a first side and metal bumps on a second side, a semiconductor die bonded on the bottom package, wherein the semiconductor die is electrically coupled to the first bumps through the interconnect structures. The device further comprises a top package bonded on the second side of the bottom package, wherein the top package comprises second bumps, and wherein each second bump and a corresponding metal bump form a joint structure between the top package and the bottom package and an underfill layer formed between the top package and the bottom package, wherein the metal bumps are embedded in the underfill layer.

20 Claims, 20 Drawing Sheets

(51) Int. Cl.
*H01L 21/56* (2006.01)
*H01L 23/00* (2006.01)

(52) U.S. Cl.
CPC .................. *H01L 2225/1058* (2013.01); *H01L 2924/00014* (2013.01); *H01L 2924/15311* (2013.01); *H01L 2924/181* (2015.01); *H01L 2924/18162* (2013.01)

(56) References Cited

U.S. PATENT DOCUMENTS

2010/0213591 A1    8/2010   Ho et al.
2011/0156250 A1*   6/2011   Goh et al. .................... 257/738

* cited by examiner

PACKAGE-ON-PACKAGE STRUCTURE AND METHOD OF FORMING SAME

RELATED APPLICATIONS

This application is related to U.S. Provisional Patent Application No. 61/793,543, filed Mar. 15, 2013, entitled "Package-on-Package Structure and Method of Forming Same" which application is also hereby incorporated herein by reference in its entirety.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

As semiconductor technologies further advance, package-on-package semiconductor devices have emerged as an effective alternative to further reduce the physical size of a semiconductor device. In a package on package semiconductor device, active circuits such as logic, memory, processor circuits and the like are fabricated on different wafers and packages. Two or more packages are installed on top of one another, i.e. stacked, with a standard interface to route signals between them. Much higher density can be achieved by employing package on package semiconductor devices. Furthermore, package on package semiconductor devices can achieve smaller form factors, cost-effectiveness, increased performance and lower power consumption.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely a package-on-package semiconductor device with a plurality of flattened metal bumps formed between a top package and a bottom package of the package-to-package semiconductor device. The embodiments of the disclosure may also be applied, however, to a variety of semiconductor devices. Hereinafter, various embodiments will be explained in detail with reference to the accompanying drawings.

Figure 1:
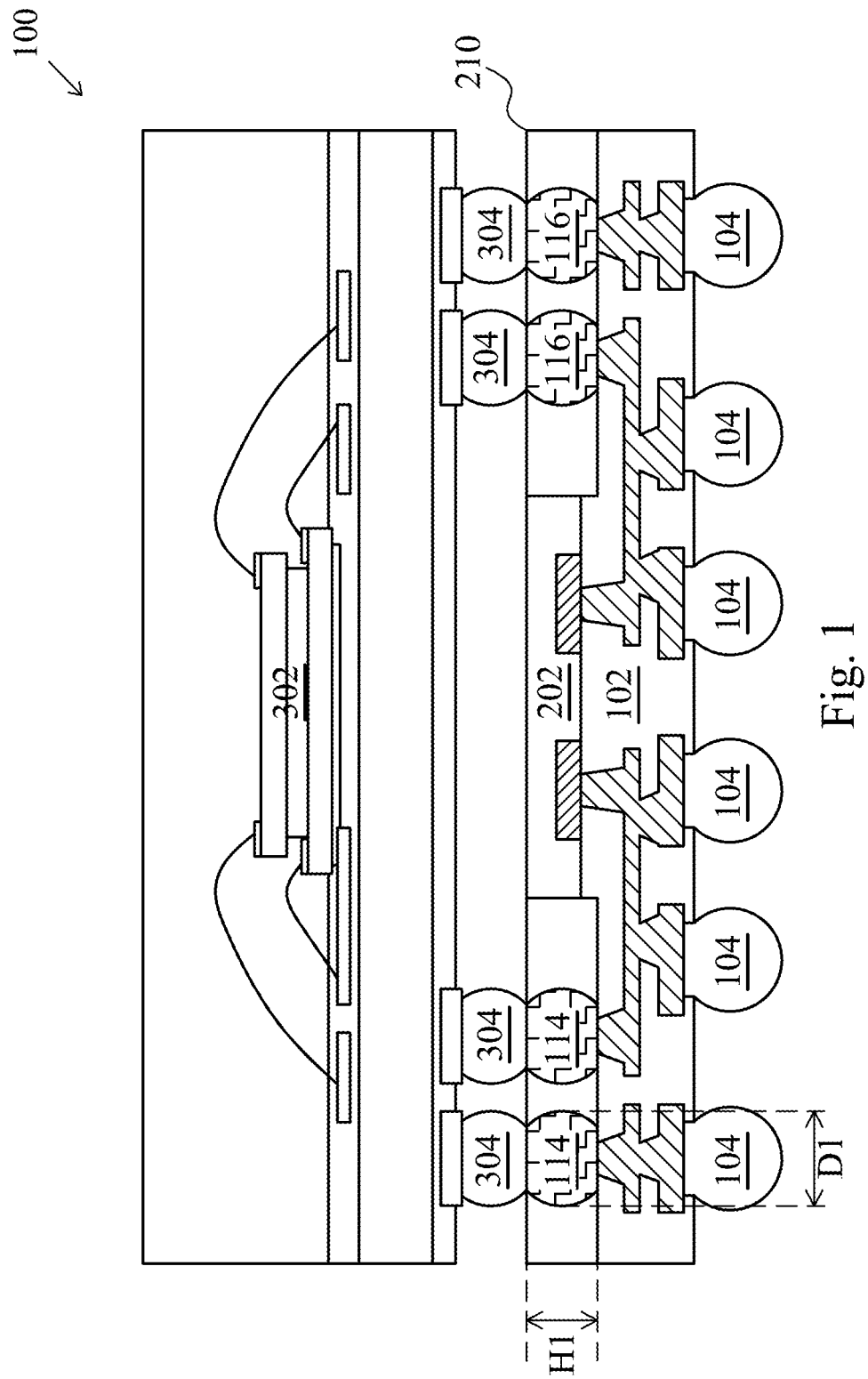
FIG. 1 illustrates a cross sectional view of a package-on-package semiconductor device in accordance with various embodiments of the present disclosure.

FIG. 1 illustrates a cross sectional view of a package-on-package semiconductor device in accordance with various embodiments of the present disclosure. The package-on-package semiconductor device 100 may include a bottom package 102 and a top package 302. In particular, the top package 302 is stacked on top of the bottom package 102. In addition, the top package 302 and the bottom package 102 are bonded together through a joint structure formed by metal bumps 114, 116 and bumps 304. The bumps 304 may be formed of copper such as copper-core solder balls. In alternative embodiments, the bumps 304 may be solder balls. Throughout the description, the bumps 304 may be alternatively referred to as solder balls 304.

As shown in FIG. 1, the metal bumps 114 and 116 are flattened metal balls. The metal bumps 114 and 116 may be of a width D1 and a height H1. In particular, D1 is greater than H1. A ratio of H1 to D1 is in a range from about 10% to about 90%.

Furthermore, the metal bump such as metal bump 114 is of a first planar surface in direct contact with interconnect structures of the bottom package 102. On the other hand, the second planar surface of the metal bump such as metal bump 114 is in direct contact with the solder balls 304. The connection between the metal bump 114 and the solder ball 304 may be generated by a reflow process.

In some embodiments, metal bumps 114 and 116 are formed of metal materials such as copper. Throughout the description, the bumps 114 and 116 are alternatively referred to as metal bumps or copper balls 114 and 116. In alternative embodiments, the bumps 114 and 116 may be copper-core solder balls.

A plurality of bumps 104 is formed on a first side of the bottom package 102. There may be a plurality of under bump metallization (UBM) structures formed underneath the bumps 104. The detailed formation processes of the bumps 104 and the UBM structures will be described below with respect to FIG. 15.

A semiconductor die 202 is bonded on a second side of the bottom package 102. The input/output terminals such as contacts are in direct contact with the interconnect structures of the bottom package 102. This configuration of the semiconductor die and the bottom package is different from conventional package-on-package semiconductor devices having a plurality of bumps such as micro bumps coupled between a semiconductor die and a bottom package. The detailed bonding process as well as the structure of the semiconductor die 202 will be described below with respect to FIG. 10.

As shown in FIG. 1, an underfill layer 210 is formed between the top package 302 and the bottom package 102. In particular, there may be a gap between the top surface of the underfill layer 210 and the top package 302. The copper balls 114 and 116 are embedded in the underfill layer 210. The semiconductor die 202 are partially embedded in the underfill layer 210. More particularly, the top surface of the semiconductor die 202 is exposed outside the underfill layer 210. In other words, the top surface of the underfill layer 210 may be coplanar with the top surface of the semiconductor die 202.

It should be noted that the number of bumps (e.g., copper balls 114 and 116) shown in FIG. 1 is merely an example. A person skilled in the art will recognize that the package-on-package semiconductor device 100 may accommodate any number of bumps. It should further be noted that the underfill layer 210 shown in FIG. 1 is merely an example. One person skilled in the art will recognize there may be many variations, modifications and alternatives. For example, the underfill layer 210 may be formed of a variety of suitable materials. In addition, the height of the underfill layer 210 may vary depending on a variety of applications and different design needs.

FIGS. 2-20 illustrate intermediate steps of fabricating the package-on-package semiconductor device shown in FIG. 1 in accordance with various embodiments of the present disclosure. It should be noted that the fabrication steps as well as the package-on-package structure shown in FIGS. 2-20 are merely an example. A person skilled in the art will recognize there may be many alternatives, variations and modifications.

Figure 2:
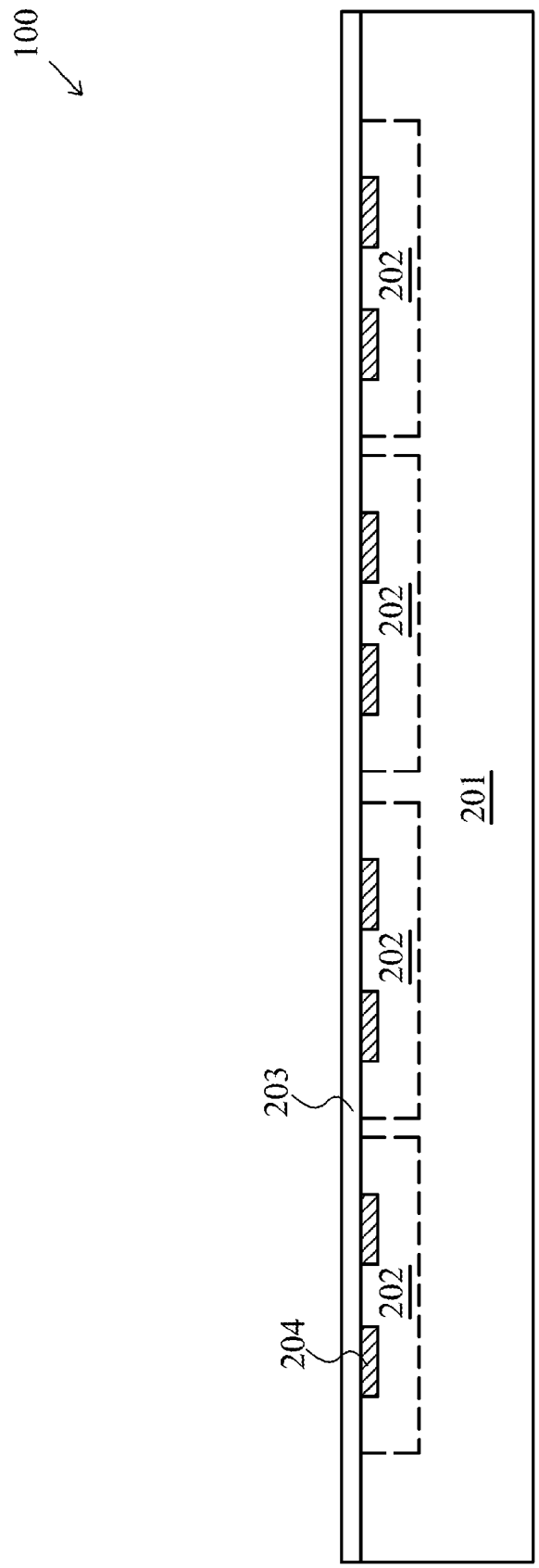
FIG. 2 illustrates a semiconductor wafer comprising a plurality of semiconductor dies in accordance with various embodiments of the present disclosure.

FIG. 2 illustrates a semiconductor wafer comprising a plurality of semiconductor dies in accordance with various embodiments of the present disclosure. The semiconductor wafer 201 may be a silicon substrate. In some embodiments, the semiconductor wafer may be a standard wafer having a thickness more than 100 um. In accordance with alternative embodiments, the semiconductor wafer 201 may be of a thickness equal to or greater than 770 um.

As shown in FIG. 2, a plurality of semiconductor dies 202 are formed in the semiconductor wafer 201. In addition, a protection layer 203 is formed on a front side of the semiconductor wafer 201. Throughout the description, the side of the semiconductor wafer 201 having a plurality of semiconductor dies 202 is alternatively referred to as the front side. The opposite side of the semiconductor wafer 201 is referred to as the backside of the semiconductor wafer 201.

In order to give a basic insight of the inventive aspects of various embodiments, the semiconductor dies 202 are drawn without details. However, it should be noted that the semiconductor dies 202 may comprise basic semiconductor layers such as active circuit layers, substrate layers, inter-layer dielectric (ILD) layers and inter-metal dielectric (IMD) layers (not shown respectively).

The semiconductor dies 202 may comprise a substrate (not shown). The substrate may be a silicon substrate. Alternatively, the substrate may be a silicon-on-insulator substrate. The substrate may further comprise a variety of electrical circuits (not shown). The electrical circuits formed on the substrate may be any type of circuitry suitable for a variety of applications such as logic circuits.

In some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An isolation layer (not shown) is formed on the substrate. The isolation layer may be formed, for example, of a dielectric material, such as silicon oxide. The isolation layer may be formed by any suitable method known in the art, such as spinning, chemical vapor deposition (CVD), plasma enhanced CVD (PECVD) and/or the like. It should also be noted that one skilled in the art will recognize that the isolation layer may further comprise a plurality of dielectric layers.

A redistribution layer 204 is formed on the isolation layer. The active circuit layer (not shown) of the semiconductor dies 202 may be bridged by the redistribution layer so that the active circuit layer of the semiconductor dies (e.g., semiconductor die 202) can be electrically coupled to external circuits. It should be noted that while FIG. 2 shows the input/output terminal of the semiconductor dies 202 is a redistribution layer, a person skilled in the art will recognize that there may be many variations, alternatives and modifications. For example, the input/output terminal of the semiconductor dies 202 may be a connector formed over the substrate of the semiconductor die. The connector may be a redistribution line, a metal line, a bond pad and/or the like.

A protection layer 203 is formed over the front side of semiconductor wafer 201. The protection layer 203 may be formed suitable materials such as polymer, silicon nitride, photoresist materials, any combinations thereof and/or the like.

Figure 3:
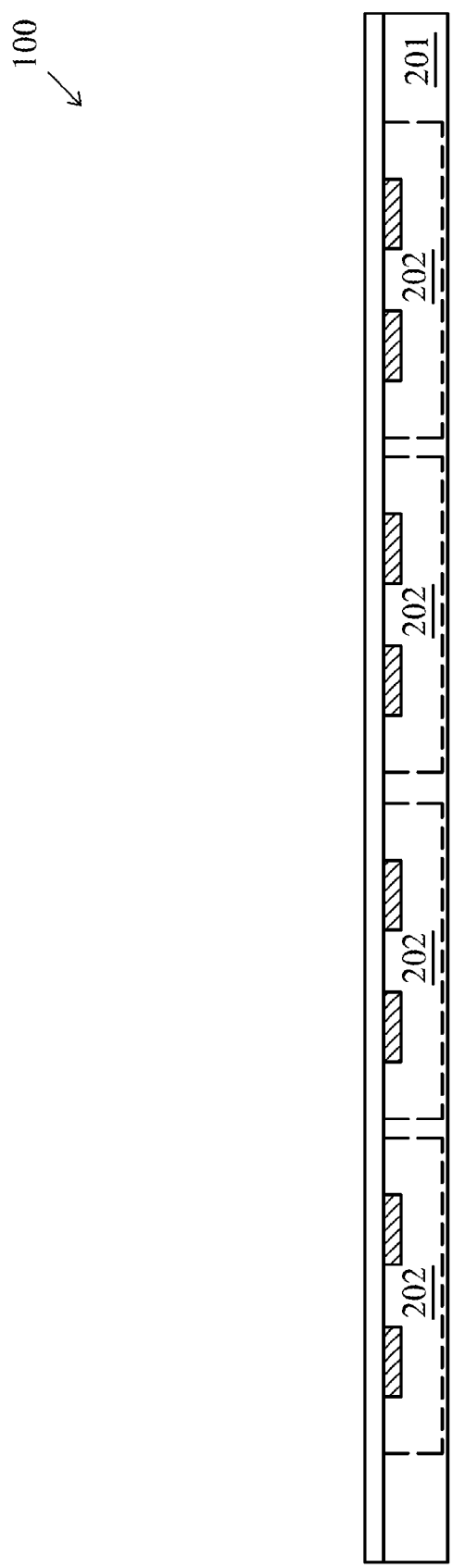
FIG. 3 illustrates a cross sectional view of the semiconductor device shown in FIG. 2 after a backside grinding process is applied to the backside of the semiconductor wafer in accordance with various embodiments of the present disclosure.

FIG. 3 illustrates a cross sectional view of the semiconductor device shown in FIG. 2 after a backside grinding process is applied to the backside of the semiconductor wafer in accordance with various embodiments of the present disclosure. The backside of the semiconductor wafer 201 undergoes a thinning process. The thinning process can employ a mechanical grinding process, a chemical polishing process, an etching process and/or the like. By employing the thinning process, in some embodiments, the backside of the semiconductor wafer 201 can be ground so that the semiconductor wafer 201 may have a thickness of approximately sub-100 um.

In accordance with an embodiment, the thickness of the semiconductor wafer 201 may be reduced to a range from about 20 um to about 50 um. In alternative embodiments, the thinning process is applied to the backside of the semiconductor wafer 201 until the embedded semiconductor dies 202 become exposed.

Figure 4:
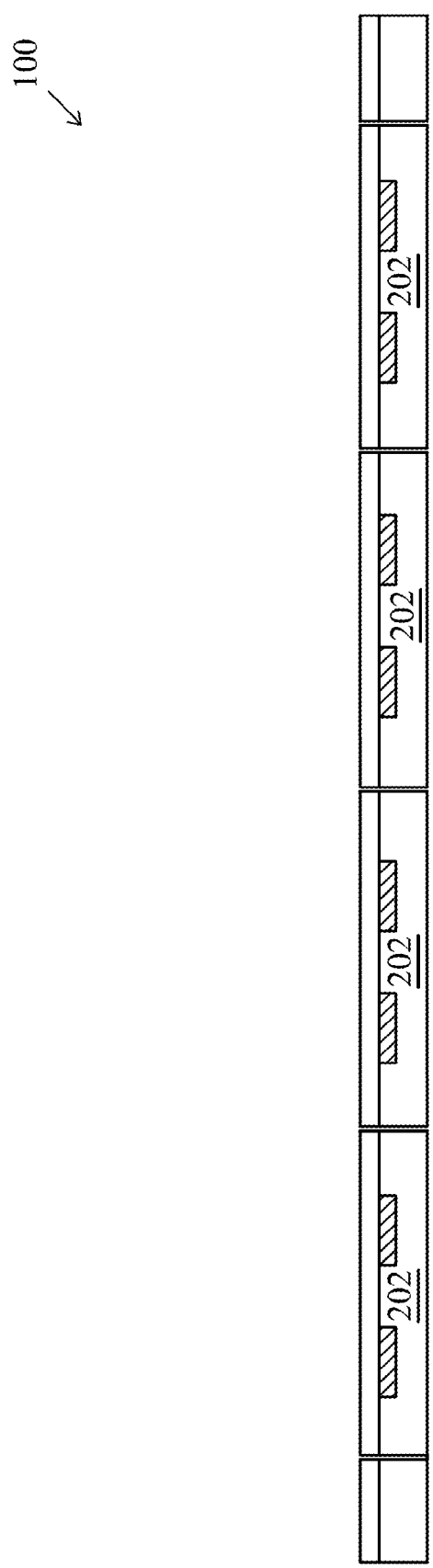
FIG. 4 illustrates a cross sectional view of the semiconductor device shown in FIG. 3 after a dicing process is applied to the semiconductor device in accordance with various embodiments of the present disclosure.

FIG. 4 illustrates a cross sectional view of the semiconductor device shown in FIG. 3 after a dicing process is applied to the semiconductor device in accordance with various embodiments of the present disclosure. A suitable dicing process may be employed to separate the semiconductor wafer 201 into a plurality of individual chip packages (e.g., semiconductor die 202). The dicing process is well known in the art, and hence is not discussed in detail herein to avoid repetition.

Figure 5:
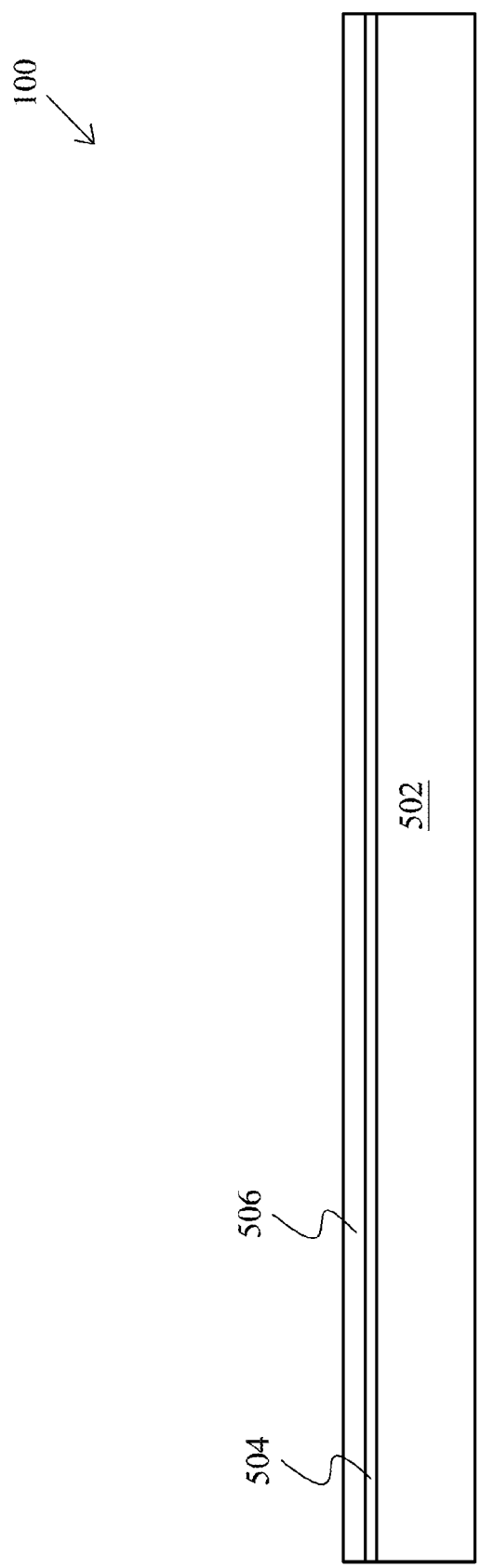
FIG. 5 illustrates a cross sectional view of a carrier in accordance with various embodiments of the present disclosure.

FIG. 5 illustrates a cross sectional view of a carrier in accordance with various embodiments of the present disclosure. A carrier 502 may be employed to prevent a thin wafer (e.g., semiconductor die 202 shown in FIG. 4) of a package-to-package semiconductor device from cracking, warping, breaking and the like. A release layer 504 is formed on top of the carrier 502. The release layer 504 may be formed of suitable materials such as polymer and/or the like. The release layer 504 may be UV-curable. In some embodiments, the release layer 504 may be spin-coated on the carrier 502.

An adhesive layer 506 may be spin-coated on the release layer 504. The adhesive layer 506 may be formed of suitable materials such as polymer and/or the like. In alternative embodiments, the adhesive layer 506 may be suitable tapes such as die attach film (DAF), non-conductive film (NCF) and/or the like. The adhesive layer 506 may be removed by using chemical solvent, chemical mechanical polishing (CMP) and/or the like.

Figure 6:
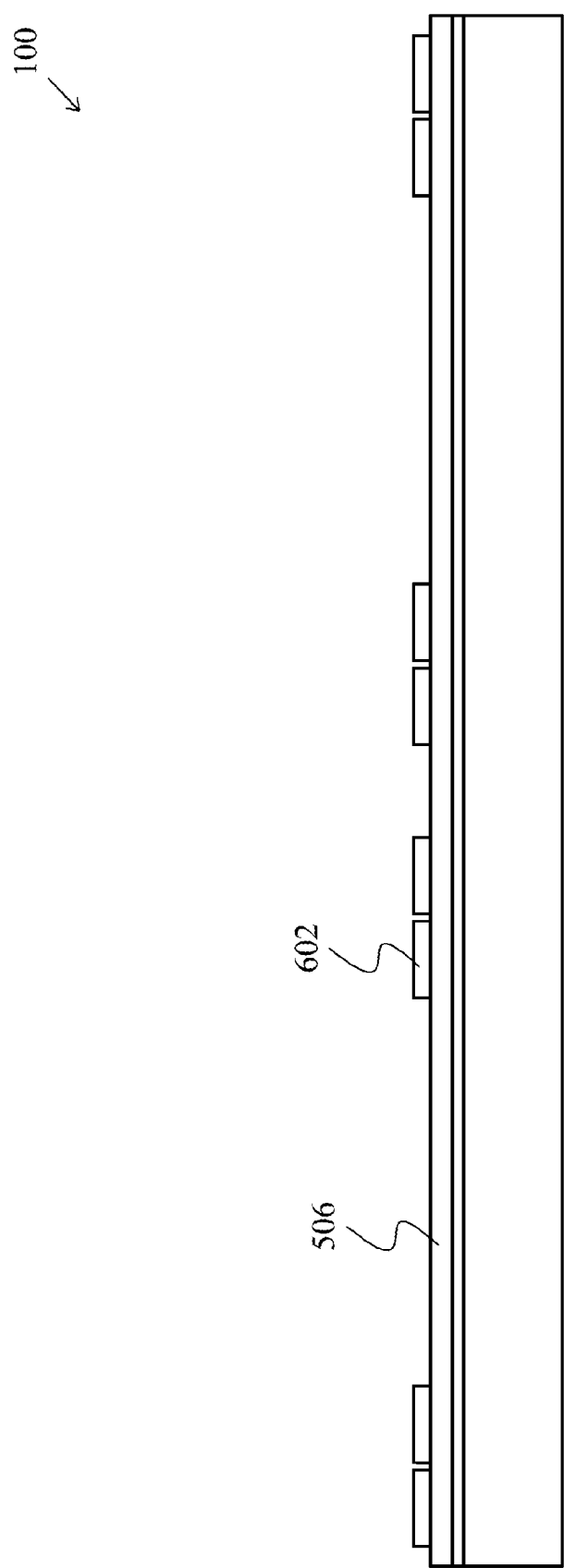
FIG. 6 illustrates a cross sectional view of the semiconductor device shown in FIG. 5 after an adhesive printing process is applied to the carrier in accordance with various embodiments of the present disclosure.

FIG. 6 illustrates a cross sectional view of the semiconductor device shown in FIG. 5 after an adhesive printing process is applied to the carrier in accordance with various embodiments of the present disclosure. According to the locations of the metal bumps (e.g., metal bumps 114 and 116) shown in FIG. 1, a plurality of adhesive pads 602 may be printed on the adhesive layer 506. The adhesive pads may be formed of suitable materials such as flux and/or the like.

Figure 7:
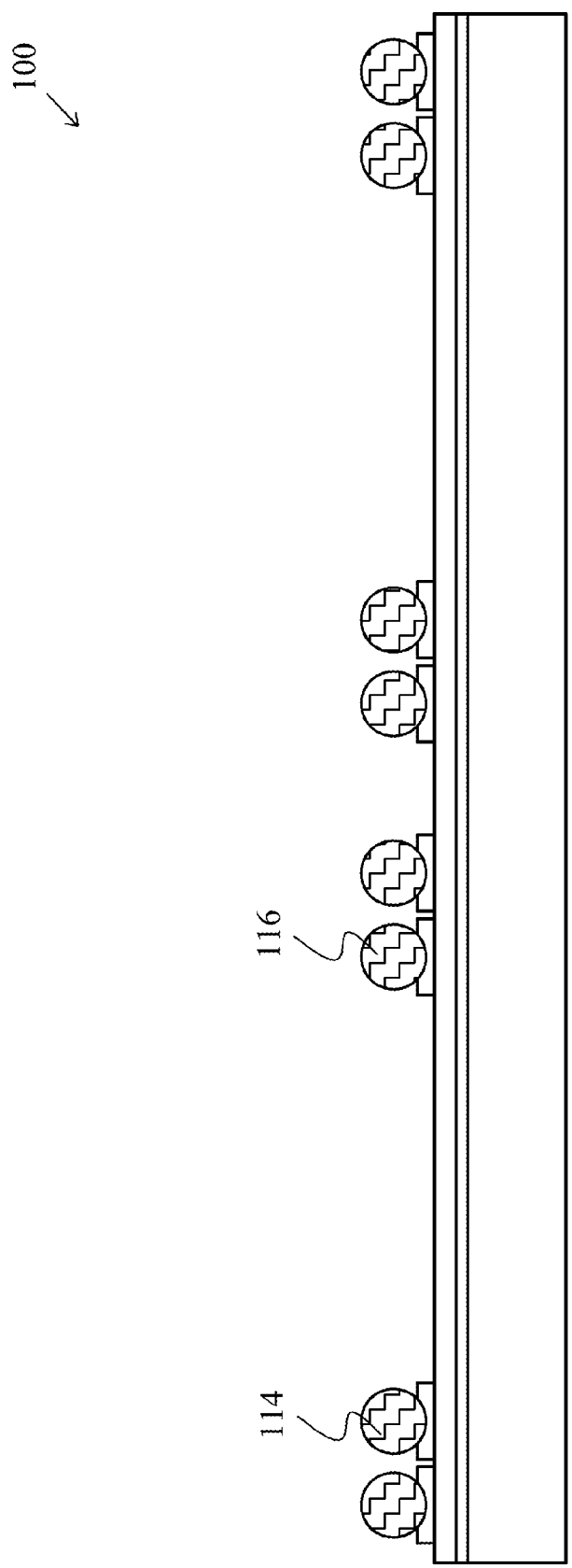
FIG. 7 illustrates a cross sectional view of the semiconductor device shown in FIG. 6 after metal bumps are mounted on the adhesive pads in accordance with various embodiments of the present disclosure.

FIG. 7 illustrates a cross sectional view of the semiconductor device shown in FIG. 6 after metal bumps are mounted on the adhesive pads in accordance with various embodiments of the present disclosure. A plurality of copper balls 114 and 116 are mounted on the adhesive pads 602. One advantageous feature of having such metal ball placement method is that using adhesive pads to hold the metal bumps helps to reduce some fabrication steps such as a reflow process. As a result, the cost as well as the efficiency of fabricating a package-on-package semiconductor device may be improved.

Figure 8:
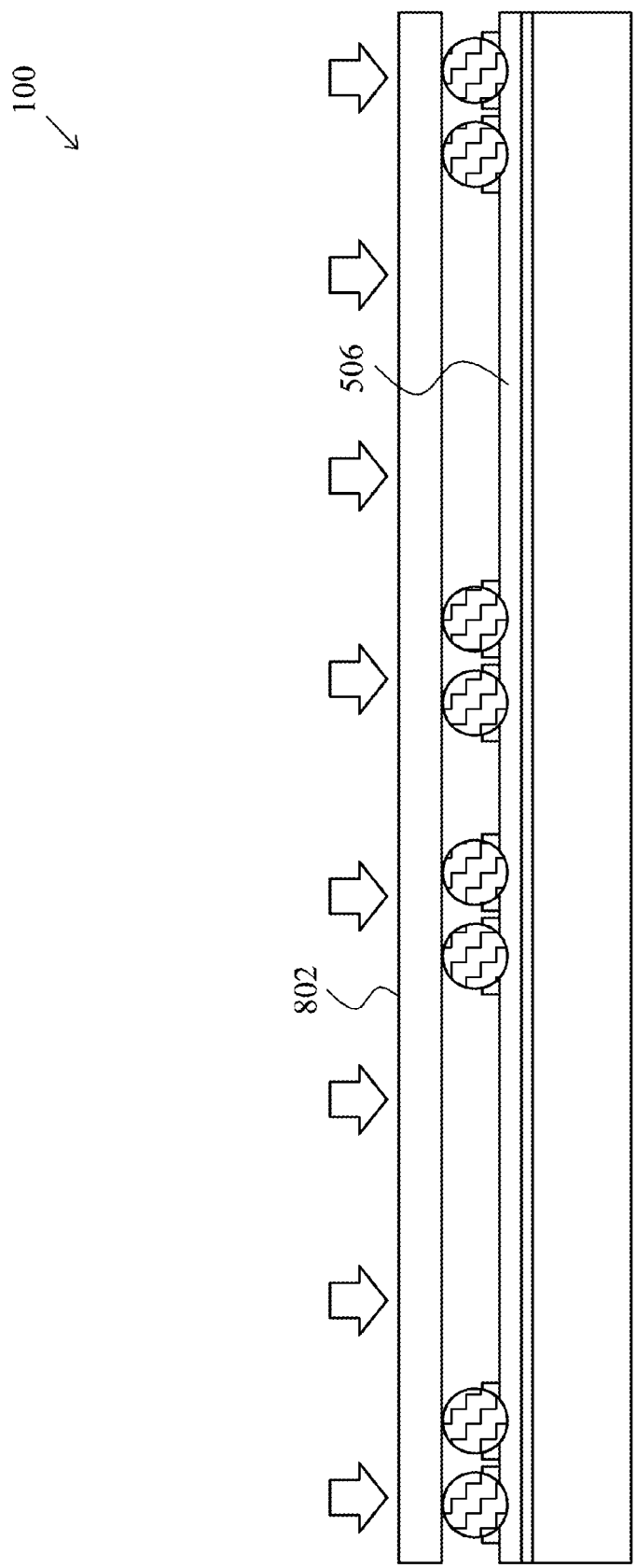
FIG. 8 illustrates a method of pressing the metal bumps into the adhesive layer in accordance with various embodiments of the present disclosure.

FIG. 8 illustrates a method of pressing the metal bumps into the adhesive layer in accordance with various embodiments of the present disclosure. As shown in FIG. 8, a metal plate 802 is applied to the top of the metal bumps 114 and 116. As the pressure from the metal plate 802 is applied, portions of the metal bumps 114 and 116 may be pressed into the adhesive layer 506. As a result, the bottom surface of the metal bumps may be lower than the top surface of the adhesive layer 506.

Figure 9:
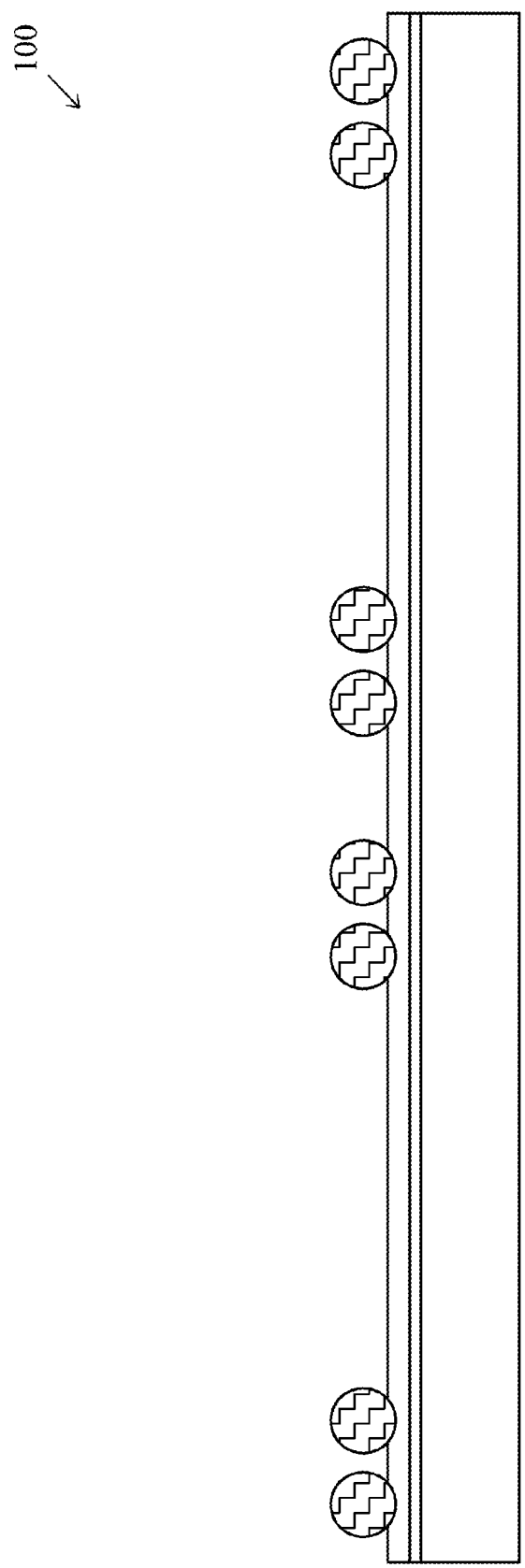
FIG. 9 illustrates a cross sectional view of the semiconductor device shown in FIG. 8 after the adhesive pads on the carrier have been removed in accordance with various embodiments of the present disclosure.

FIG. 9 illustrates a cross sectional view of the semiconductor device shown in FIG. 8 after the adhesive pads on the carrier have been removed in accordance with various embodiments of the present disclosure. After the metal bumps 114 and 116 have been pressed into the adhesive layer 506, the adhesive pads 602 may be removed through suitable adhesive removal processes such as a chemical solvent based removal process.

Figure 10:
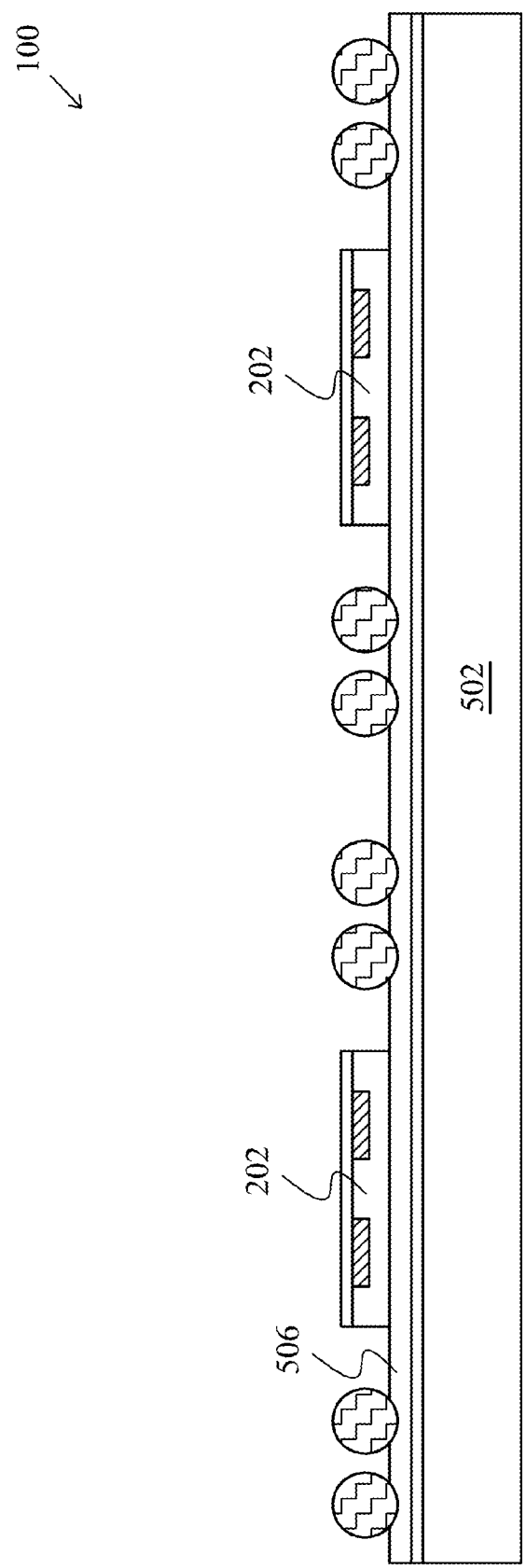
FIG. 10 illustrates a cross sectional view of the semiconductor device shown in FIG. 9 after a plurality of semiconductor dies are mounted on the carrier in accordance with various embodiments of the present disclosure.

FIG. 10 illustrates a cross sectional view of the semiconductor device shown in FIG. 9 after a plurality of semiconductor dies are mounted on the carrier in accordance with various embodiments of the present disclosure. The semiconductor dies 202 are picked and placed on top of the carrier 502. The semiconductor dies 202 are bonded on the carrier 502 through the adhesive layer 506. It should be noted that while FIG. 10 illustrates two semiconductor dies bonded on the carrier 502, the carrier 502 may accommodate any number of semiconductor dies.

Figure 11:
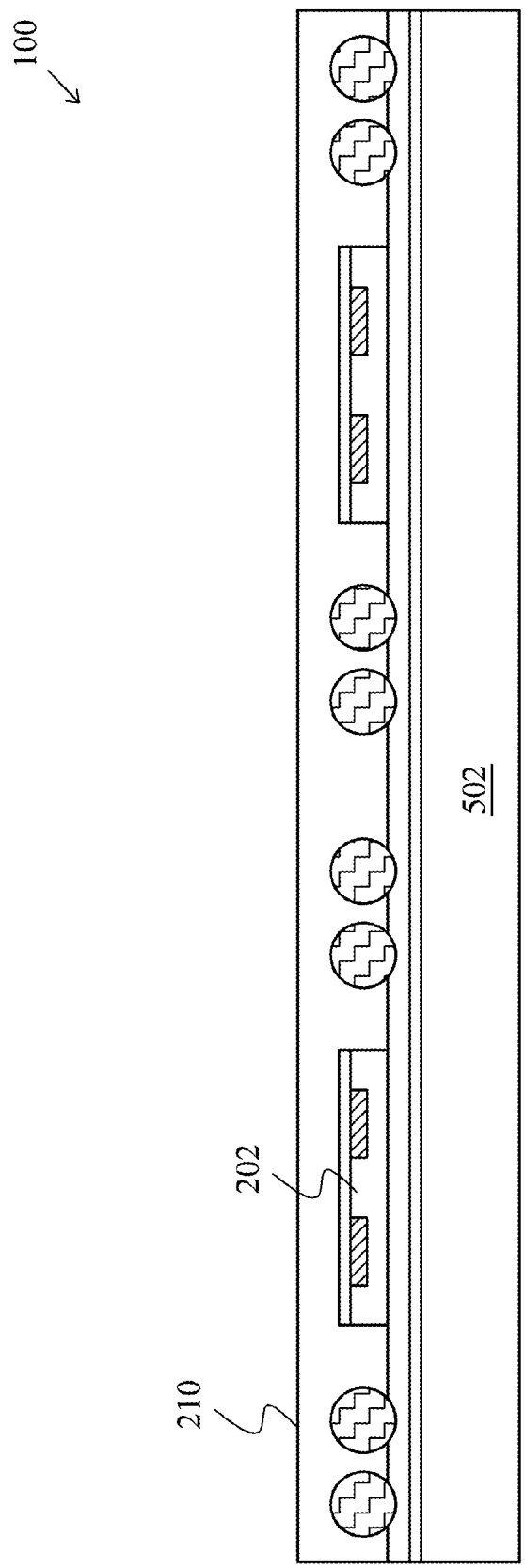
FIG. 11 illustrates a cross sectional view of the semiconductor device shown in FIG. 10 after an encapsulation layer is formed over the carrier in accordance with various embodiments of the present disclosure.

FIG. 11 illustrates a cross sectional view of the semiconductor device shown in FIG. 10 after an encapsulation layer is formed over the carrier in accordance with various embodiments of the present disclosure. The encapsulation layer 210 is formed over the carrier 502 as shown in FIG. 11. In accordance with some embodiments, the encapsulation layer 210 may be a molding compound layer formed of suitable underfill materials. Throughout the description, the encapsulation layer 210 may be alternatively referred to as an underfill layer 210 or a molding compound layer 210.

The underfill material layer 210 may fill the gaps between the semiconductor dies 202 and bumps mounted on top of the carrier 502. In some embodiments, the underfill material layer 210 may be formed of an epoxy, which is dispensed at the gaps between the bumps and the semiconductor die 202. The epoxy may be applied in a liquid form, and may harden after a curing process.

In alternative embodiments, the underfill material layer 210 may be formed of curable materials such as polymer based materials, resin based materials, polyimide, epoxy and any combinations of thereof. The underfill material layer 210 can be formed by any suitable dispense techniques.

Figure 12:
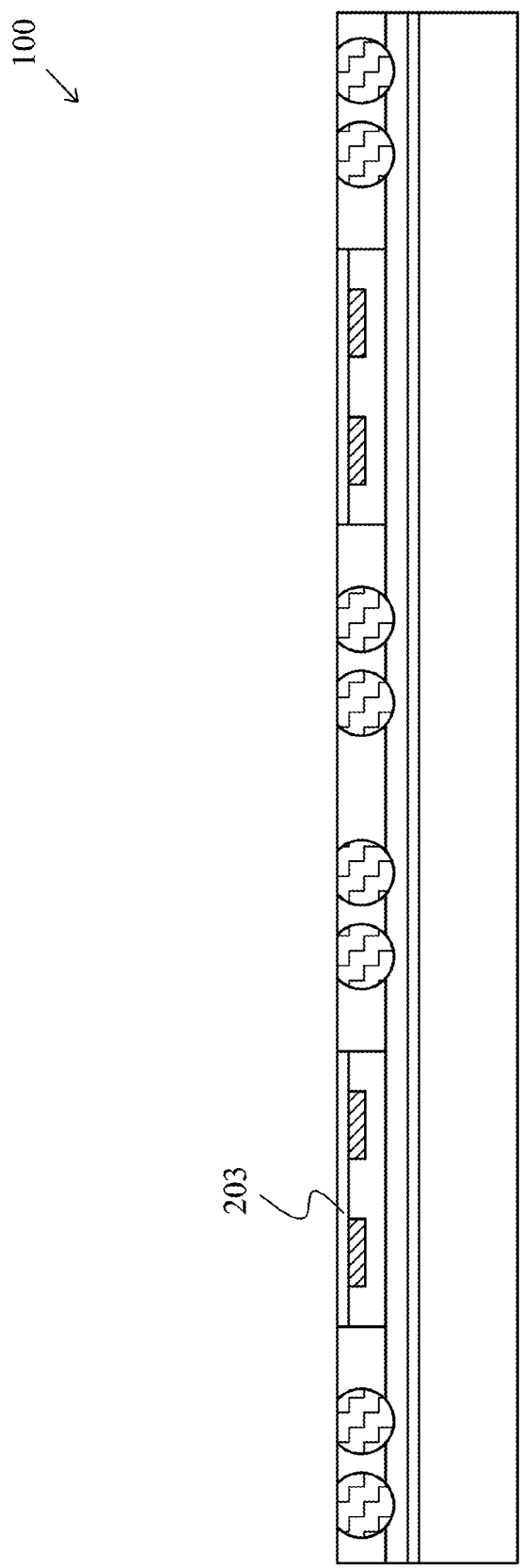
FIG. 12 illustrates a cross sectional view of the semiconductor device shown in FIG. 11 after a grinding process is applied to the top surface of the encapsulation layer in accordance with various embodiments of the present disclosure.

FIG. 12 illustrates a cross sectional view of the semiconductor device shown in FIG. 11 after a grinding process is applied to the top surface of the encapsulation layer in accordance with various embodiments of the present disclosure. The top surface of the encapsulation layer 210 undergoes a grinding process. The grinding process can employ a mechanical grinding process, a chemical polishing process, an etching process, any combinations thereof and/or the like.

As shown in FIG. 12, the grinding process is applied to the top surface of the encapsulation layer 210 until the top surfaces of the semiconductor dies 202 become exposed. In particular, as shown in FIG. 12, the protection layer 203 of the semiconductor die 202 may be exposed outside the encapsulation layer 210. One advantageous feature of having a protection layer 203 over the semiconductor die 202 is that the top surface of the semiconductor die 202 may be protected from being damaged during the grinding process.

Figure 13:
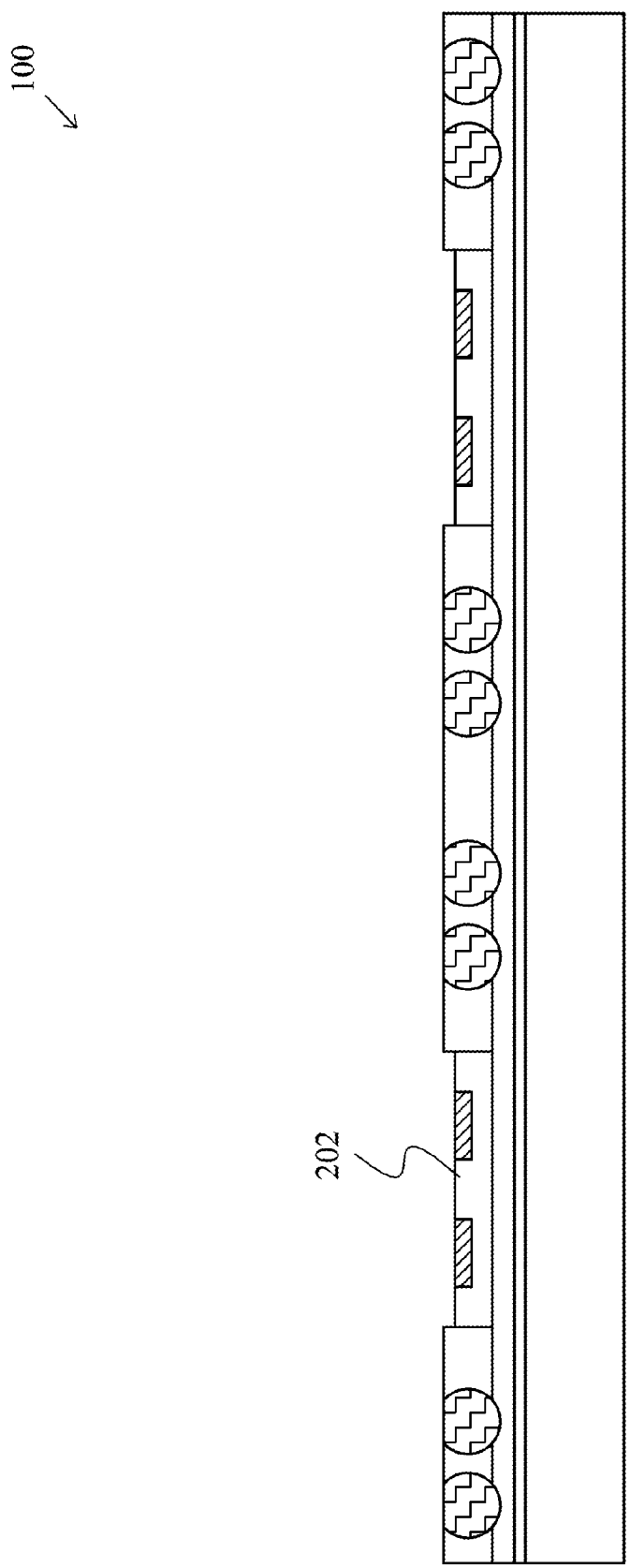
FIG. 13 illustrates a cross sectional view of the semiconductor device shown in FIG. 12 after the protection layers on the semiconductor dies have been removed in accordance with various embodiments of the present disclosure.

FIG. 13 illustrates a cross sectional view of the semiconductor device shown in FIG. 12 after the protection layers on the semiconductor dies have been removed in accordance with various embodiments of the present disclosure. In accordance with some embodiments, the protection layer 203 may be formed of suitable materials such as polymer, photoresist materials and/or the like. The protection layer 203 may be removed by using chemical solvent, etching, any combinations thereof and/or the like.

Figure 14:
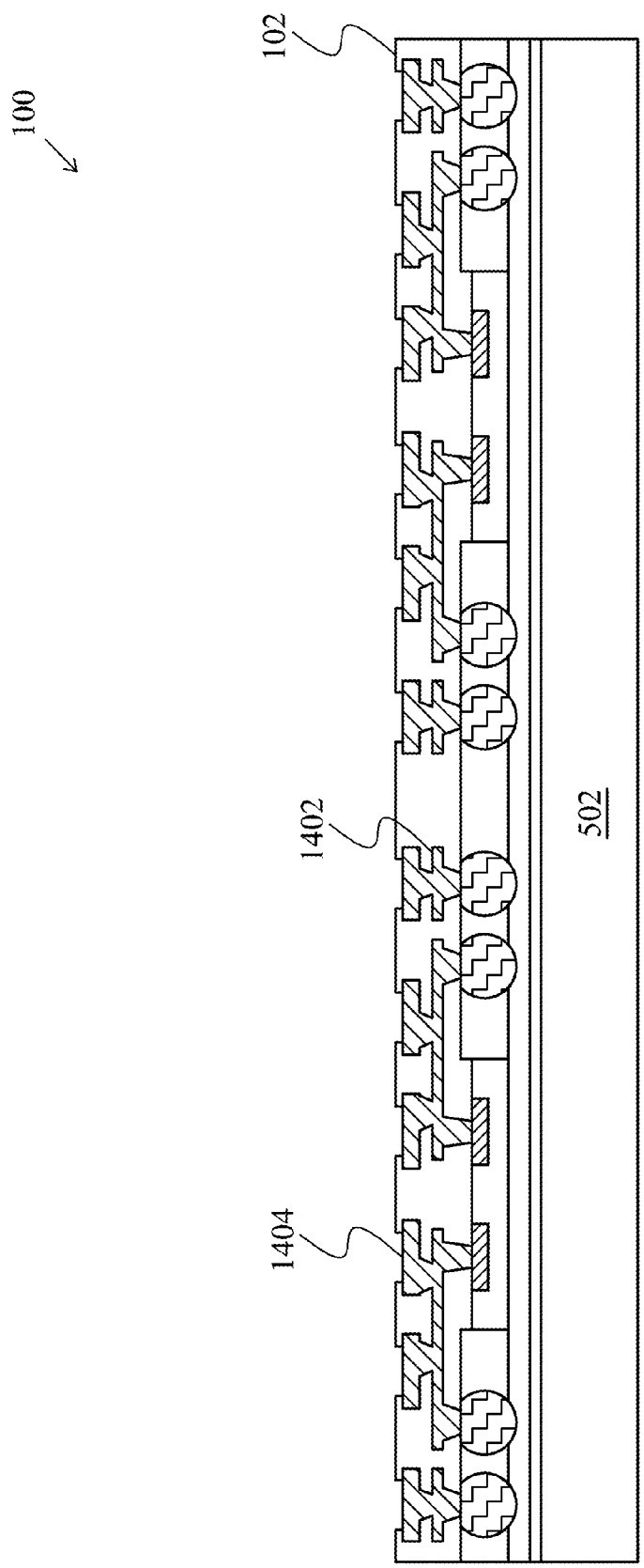
FIG. 14 illustrates a cross sectional view of the semiconductor device shown in FIG. 13 after a plurality of interconnect structures are formed over the encapsulation layer in accordance with various embodiments of the present disclosure.

FIG. 14 illustrates a cross sectional view of the semiconductor device shown in FIG. 13 after a plurality of interconnect structures are formed over the encapsulation layer in accordance with various embodiments of the present disclosure. As shown in FIG. 14, a plurality of interconnect structures are formed over the carrier 502. The interconnect structures shown in FIG. 14 may form the bottom package 102 shown in FIG. 1.

FIG. 14 further illustrates that the interconnect structure are in direct contact with the metal bumps 114 and 116, and the connectors of the semiconductor dies 202. In some embodiments, such a direct connection may be formed by suitable fabrication techniques such as plating and/or the like. As shown in FIG. 14, the top surface of the metal bumps 114 and 116 may be divided into two portions, namely an inner portion and an edge portion. The inner portion is in direct contact with the interconnect structure. The edge portion is of a planar surface.

The interconnect structures may include an ILD layer, an IMD layer, a metal line and a redistribution layer. Throughout the description, the dielectric layer in which contact plugs are formed is referred to as an ILD layer, and the dielectric layers over the ILD are referred to as IMD layers. The metal lines are formed in the IMD layers. The redistribution layer is formed over the IMD layers.

This interconnect structure shown in FIG. 14 is merely an example, which should not unduly limit the scope of the claims. One of ordinary skill in the art would recognize many variations, alternatives, and modifications. For example, the interconnect structure may comprise a plurality of IMD layers.

The ILD layer may be formed, for example, of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof or the like, by any suitable method known in the art, such as spinning, CVD, and PECVD.

One or more IMD layers and the associated metal lines (not shown) are formed over the ILD layer. Generally, the one or more IMD layers and the associated metal lines are used to interconnect the electrical circuitry to each other and to provide an external electrical connection. The IMD layers are preferably formed of a low-K dielectric material, such as fluorosilicate glass (FSG) formed by PECVD techniques or high-density plasma chemical vapor deposition (HDPCVD) or the like It should be noted the interconnect structure may comprise a plurality of metal lines 1402. The metal lines 1402 are used to interconnect the integrated circuit devices. The metal lines 1402 may be formed in different layers and separated by the ILD layer and a plurality of IMD layers.

One skilled in the art will recognize that the interconnect structure may comprise more inter-metal dielectric layers and the associated metal lines and plugs. In particular, the layers between the metallization layers may be formed by alternating layers of dielectric (e.g., extremely low-k dielectric material) and conductive materials (e.g., copper).

The metal lines 1402 may be formed of metal materials such as copper, copper alloys, aluminum, silver, gold, any combinations thereof and/or the like. The metal lines 1402 may be formed by a dual damascene process, although other suitable techniques such as deposition, single damascene may alternatively be used. The dual damascene process is well known in the art, and hence is not discussed herein The redistribution layer 1404 may be a single material layer, or a multi-layered structure and may be made of metals such as titanium, titanium nitride, aluminum, tantalum, copper and combinations thereof. The redistribution layer 1404 may be made by any suitable method known in the art such as physical vapor deposition (PVD), sputter, CVD, electroplating and/or the like.

Figure 15:
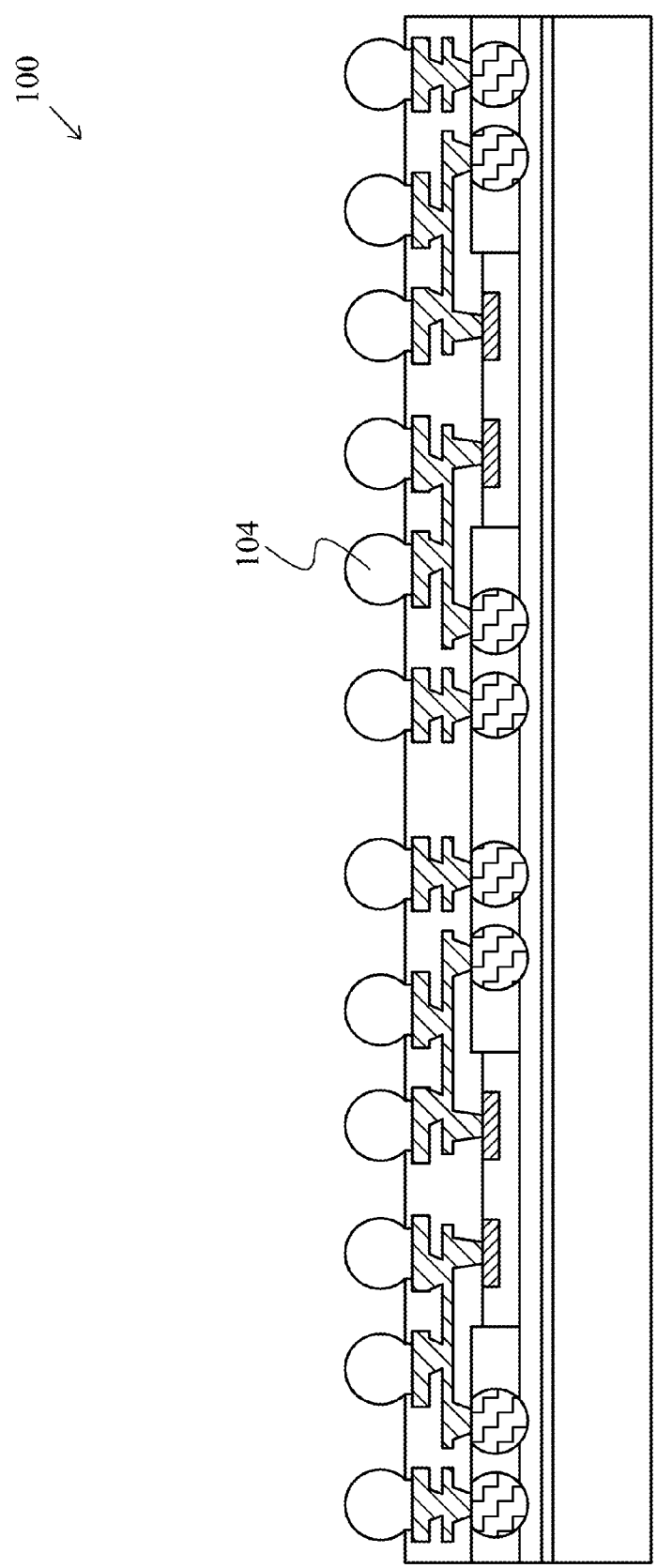
FIG. 15 illustrates a cross sectional view of the semiconductor device shown in FIG. 14 after a plurality of UBM structures and interconnection pads are formed in accordance with various embodiments of the present disclosure.

FIG. 15 illustrates a cross sectional view of the semiconductor device shown in FIG. 14 after a plurality of UBM structures and interconnection bumps are formed in accordance with various embodiments of the present disclosure. The plurality of UBM structures (not shown) are formed over the redistribution layer of the bottom package 102. The UBM structures help to prevent diffusion between the solder balls and the integrated circuits of the semiconductor device, while providing a low resistance electrical connection.

The bumps 104 are input/output (I/O) pads or interconnection bumps of the semiconductor device. In some embodiments, the bumps 104 may be formed of copper. In accordance with another embodiment, the bumps 104 may be a plurality of solder balls 104. In some embodiments, the solder balls 104 may comprise SAC405. SAC405 comprises 95.5% Sn, 4.0% Ag and 0.5% Cu. Alternatively, the bumps 104 may be a plurality of land grid array (LGA) pads.

Figure 16:
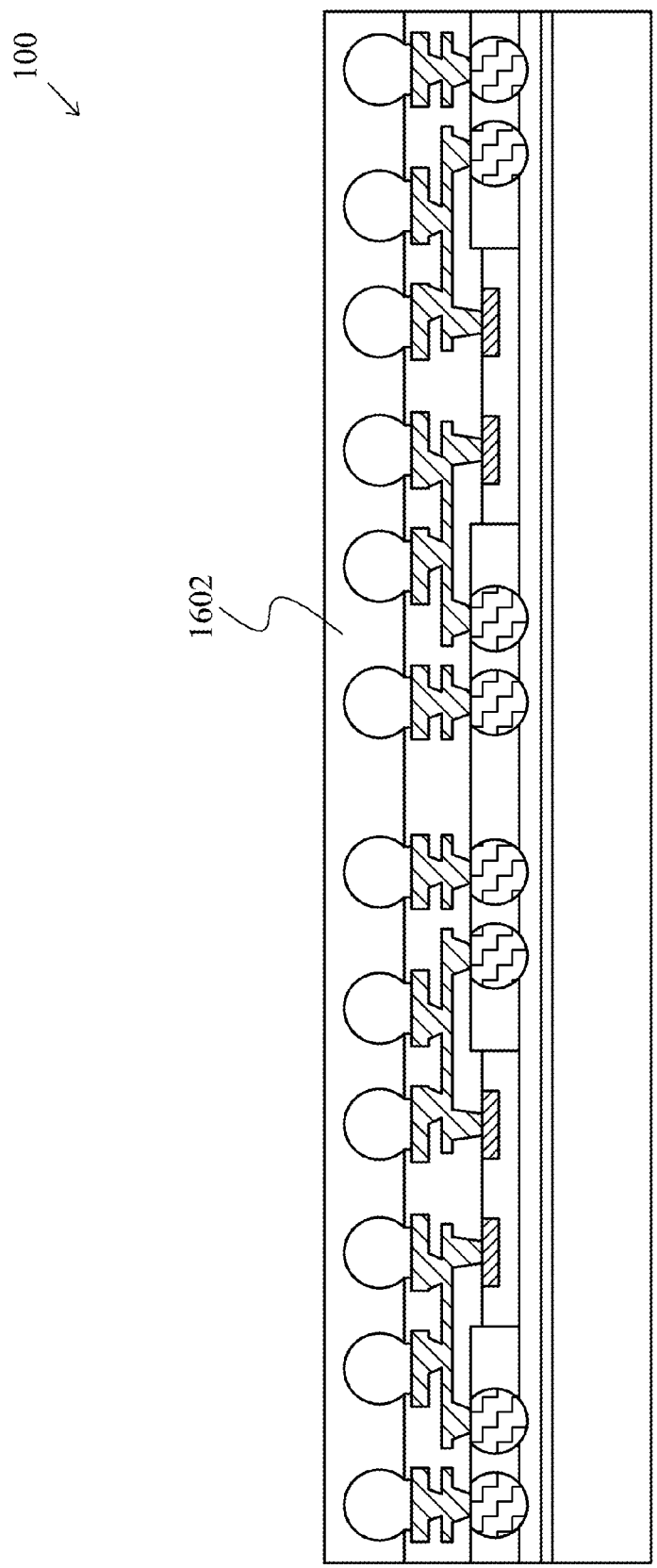
FIG. 16 illustrates a process of attaching the package-to-package semiconductor device to a tape frame in accordance with various embodiments of the present disclosure.

FIG. 16 illustrates a process of attaching the package-to-package semiconductor device to a tape frame in accordance with various embodiments of the present disclosure. A tape frame 1602 may be laminated on the bottom package 102. As shown in FIG. 16, the solder balls 104 are embedded in the tape frame 1602. Attaching a semiconductor structure to a tape frame is well known in the art, and hence is not discussed in further detail herein to avoid repetition.

Figure 17:
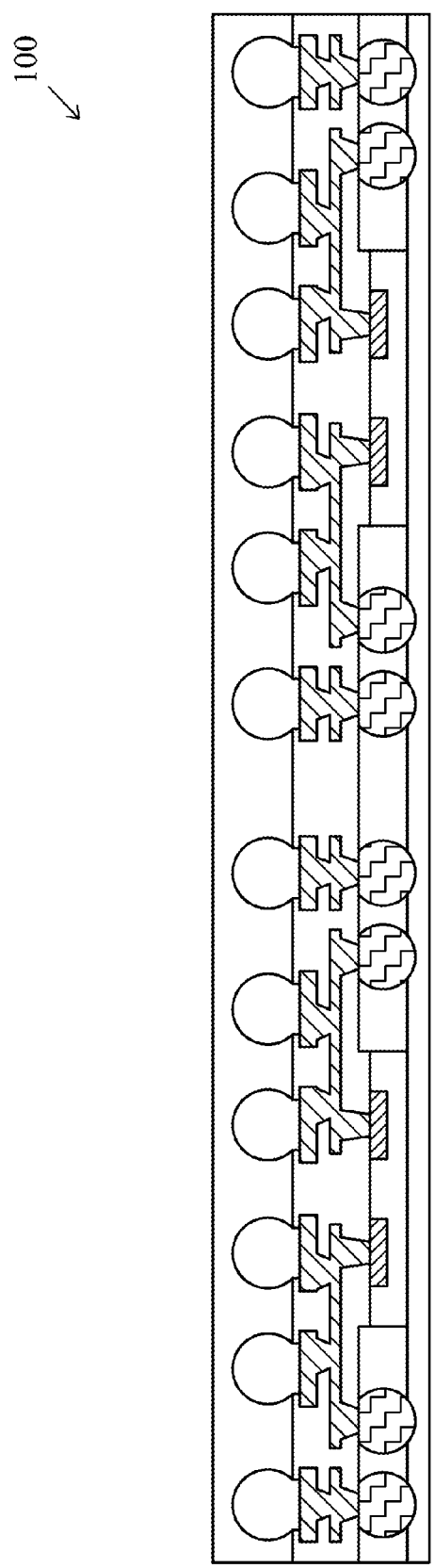
FIG. 17 illustrates a process of removing the carrier from package-to-package semiconductor device in accordance with various embodiments of the present disclosure.

FIG. 17 illustrates a process of removing the carrier from package-to-package semiconductor device in accordance with various embodiments of the present disclosure. In accordance with an embodiment, the carrier 502 can be detached from the bottom package 102. A variety of detaching processes may be employed to separate the bottom package 102 from the carrier 502. The variety of detaching processes may comprise a chemical solvent, a UV exposure, a laser ablation process and/or the like.

Figure 18:
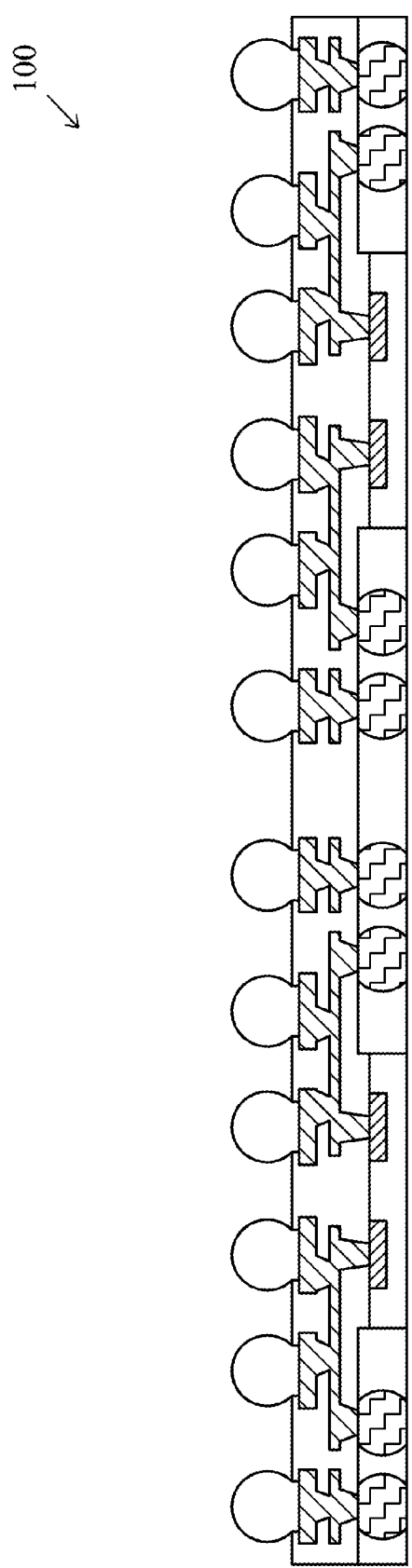
FIG. 18 illustrates a cross sectional view of the semiconductor device shown in FIG. 17 after a grinding process is applied to the adhesive layer in accordance with various embodiments of the present disclosure.

FIG. 18 illustrates a cross sectional view of the semiconductor device shown in FIG. 17 after a grinding process is applied to the adhesive layer in accordance with various embodiments of the present disclosure. The backside of the bottom package 102 undergoes a grinding process. The grinding process can employ a mechanical grinding process, a chemical polishing process, an etching process or the like.

As shown in FIG. 18, the grinding process is applied to the backside of the bottom package 102 until the semiconductor dies 202 become exposed. It should be noted that during the grinding process, one side of the metal bumps 114 and 116 may be planarized to form a plurality of flattened metal bumps. The tape frame 1602 may be detached by suitable de-taping techniques.

Figure 19:
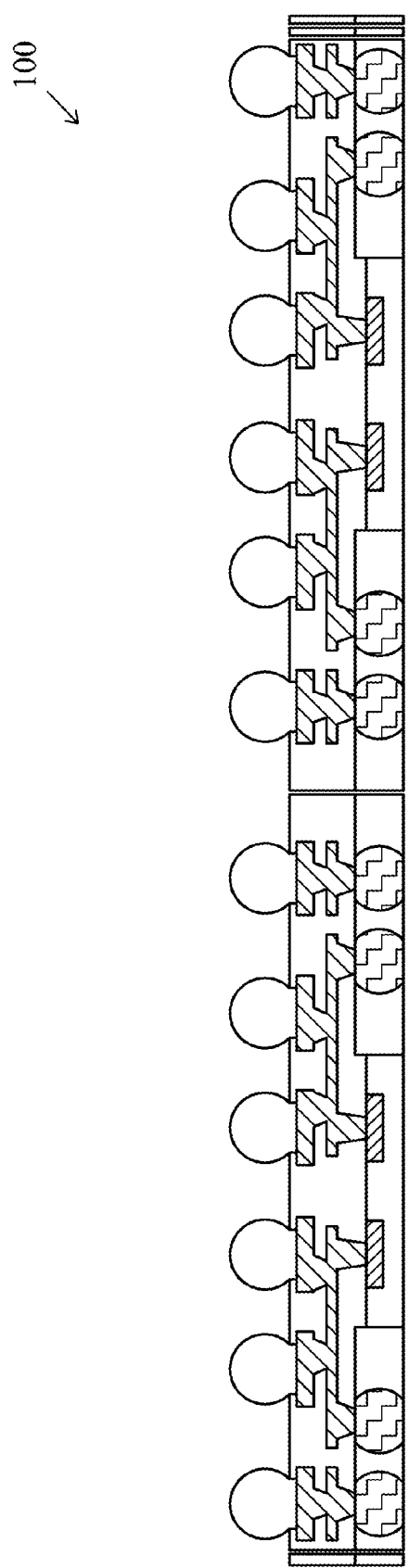
FIG. 19 illustrates a cross sectional view of the semiconductor device shown in FIG. 18 after a dicing process is applied to the semiconductor device in accordance with various embodiments of the present disclosure.

FIG. 19 illustrates a cross sectional view of the semiconductor device shown in FIG. 18 after a dicing process is applied to the semiconductor device in accordance with various embodiments of the present disclosure. A suitable dicing process may be employed to separate the bottom package 102 into individual chip packages. The dicing process is well known in the art, and hence is not discussed in detail herein.

Figure 20:
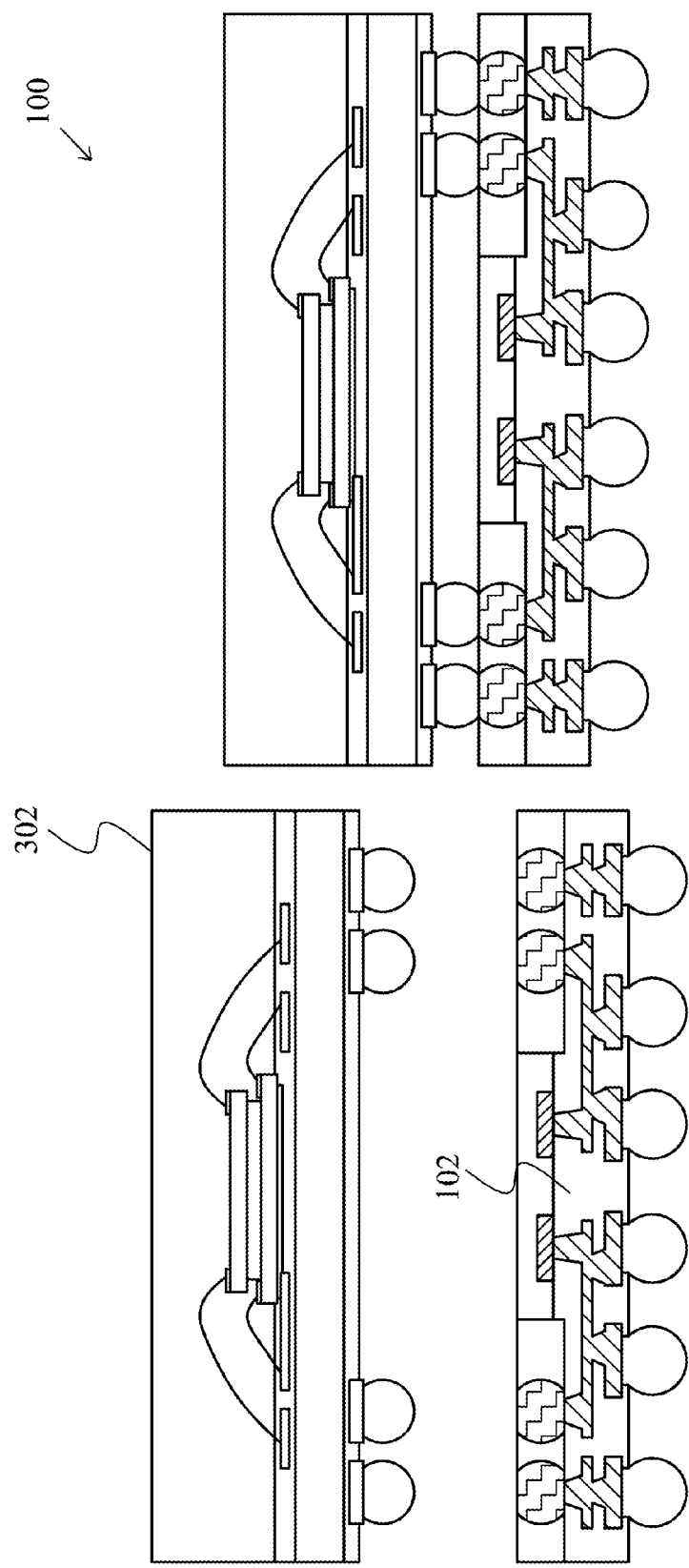
FIG. 20 illustrates a cross sectional view of the semiconductor device shown in FIG. 19 before a top package is mounted on the bottom package in accordance with various embodiments of the present disclosure.

FIG. 20 illustrates a cross sectional view of the semiconductor device shown in FIG. 19 before a top package is mounted on the bottom package in accordance with various embodiments of the present disclosure. The top package 302 may comprise a plurality of stacked dies, which may be wire bonded to the input and output terminals of the top package. The stacked dies of the top package 302 may comprise memory dies, logic dies, processor dies and/or the like.

It should be noted while FIG. 20 illustrates two stacked dies in the top package 302, this is merely an example. Likewise, the use of wire bonding is merely illustrative and other approaches for electrically connecting the stacked dies are within the contemplated scope of the present disclosure.

The top package 302 may be bonded on the bottom package 102 through a reflow process. The bonding process comprises placing the solder balls of the top package 302 against the respective metal bumps 114 and 116 on top of the front side of the bottom package 102. A reflow process is then performed to melt solder balls, thereby forming a joint structure between the top package 302 and the bottom package 102 and electrically connecting the metal bumps to the solder balls. It should be noted the prior to the reflow process, the metal bumps 114 and 116 are of a planar surface. After the reflow process, a solder ball and a corresponding metal bump may form an intermetallic compound (IMC) layer. As such, the top surface of the metal bumps 114 and 116 is not planar.

In accordance with an embodiment, a device comprises a bottom package comprising a plurality of interconnect structures, a plurality of first bumps formed on a first side of the bottom package and a plurality of metal bumps formed on a second side of the bottom package, wherein the metal bump is of a width D1 and a height H1, and wherein D1 is greater than H1.

The device further comprises a semiconductor die bonded on the second side of the bottom package, wherein the semiconductor die is electrically coupled to the first bumps through the interconnect structures, a top package bonded on the second side of the bottom package, wherein the top package comprises a plurality of second bumps, and wherein each second bump and a corresponding metal bump form a joint structure between the top package and the bottom package and an underfill layer formed between the top package and the bottom package, wherein the metal bumps are embedded in the underfill layer.

In accordance with an embodiment, a device comprises a top package mounted on a bottom package, wherein the bottom package comprises a plurality of interconnection components, a plurality of first bumps formed on a first side of the bottom package and a plurality of metal bumps formed on a second side of the bottom package, wherein the metal bump is of a width D1 and a height H1, and wherein D1 is greater than H1.

The device further comprises a semiconductor die is bonded on the second side of the bottom package, wherein the semiconductor die is electrically coupled to the first bumps through the interconnection components, interconnect structures of the semiconductor die are in direct contact with the interconnection components of the bottom package and the semiconductor die is located between the top package and the bottom package and an underfill layer formed between the top package and the bottom package.

In accordance with an embodiment, a method comprises attaching a plurality of metal bumps on a carrier through an adhesive layer, attaching a semiconductor die on the carrier through the adhesive layer, forming a molding compound layer over the carrier, wherein the semiconductor die and the metal bumps are embedded in the molding compound layer, grinding the molding compound layer until a top surface of the semiconductor die is exposed, forming a bottom package comprising a plurality of interconnect structures over the molding compound layer, attaching the bottom package on a tape frame, grinding the adhesive layer until the semiconductor die is exposed and mounting a top package on the bottom package, wherein the semiconductor die is located between the top package and the bottom package.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
a bottom package comprising:
  a plurality of interconnect structures;
  a plurality of first bumps formed on a first side of the bottom package; and
  a plurality of metal bumps formed on a second side of the bottom package, wherein the metal bump is of a width D1 and a height H1, and wherein D1 is greater than H1, and wherein each metal bump has a planar top surface and a planar bottom surface;
a semiconductor die bonded on the second side of the bottom package, wherein the semiconductor die is electrically coupled to the first bumps through the interconnect structures and a redistribution layer of the semiconductor die is in direct contact with the interconnect structures;

a top package bonded on the second side of the bottom package, wherein:
the top package comprises a plurality of second bumps, and wherein each second bump and a corresponding metal bump form a joint structure between the top package and the bottom package; and an underfill layer formed between the top package and the bottom package, wherein the metal bumps are embedded in the underfill layer and a bottom surface of the underfill layer is level with the planar bottom surface.

2. The device of claim 1, wherein:
a top surface of the semiconductor die is exposed outside the underfill layer.

3. The device of claim 1, wherein:
a ratio of H1 to D1 is in a range from about 10% to about 90%.

4. The device of claim 1, wherein:
the metal bumps are flattened balls, and wherein each metal bump is a portion of a ball.

5. The device of claim 1, further comprising:
a gap between the underfill layer and the top package.

6. The device of claim 1, wherein:
the metal bumps are formed of copper.

7. The device of claim 1, wherein:
the first bumps are formed of solder, copper and any combination thereof; and
the second bumps are formed of solder, copper and any combination thereof.

8. A device comprising:
a top package mounted on a bottom package, wherein the bottom package comprises:
    a plurality of interconnection components;
    a plurality of first bumps formed on a first side of the bottom package; and
    a plurality of metal bumps formed on a second side of the bottom package, wherein the metal bump is of a width D1 and a height H1, and wherein D1 is greater than H1;
a semiconductor die is bonded on the second side of the bottom package, wherein:
    the semiconductor die is electrically coupled to the first bumps through the interconnection components; and
    the semiconductor die is located between the top package and the bottom package, wherein a surface of a redistribution layer of the semiconductor die is in direct contact with a surface of a via of the interconnect components; and
an underfill layer formed between the top package and the bottom package, wherein a top surface of the underfill layer is level with top surfaces of the metal bumps and a bottom surface of the underfill layer is level with bottom surfaces of the metal bumps.

9. The device of claim 8, further comprising:
a plurality of second bumps formed on the top package, wherein the second bumps and the metal bumps form a plurality of joint structures.

10. The device of claim 9, wherein:
the joint structures are located between the top package and the bottom package.

11. The device of claim 8, wherein:
a top surface of the semiconductor die is exposed outside the underfill layer.

12. The device of claim 8, wherein:
the interconnection components comprise at least a metal line formed in an inter-metal dielectric layer.

13. The device of claim 8, wherein:
the metal bumps are embedded in the underfill layer.

14. The device of claim 8, wherein:
a ratio of H1 to D1 is in a range from about 10% to about 90%.

15. A method comprising:
attaching a plurality of metal bumps on a carrier through an adhesive layer;
attaching a semiconductor die on the carrier through the adhesive layer;
forming a molding compound layer over the carrier, wherein the semiconductor die and the metal bumps are embedded in the molding compound layer;
grinding the molding compound layer until a top surface of the semiconductor die is exposed;
forming a bottom package comprising a plurality of interconnect structures over the molding compound layer;
attaching the bottom package on a tape frame;
grinding the adhesive layer until the semiconductor die is exposed; and
mounting a top package on the bottom package, wherein the semiconductor die is located between the top package and the bottom package.

16. The method of claim 15, wherein the interconnect structures comprise:
an inter-metal dielectric (IMD) layer;
a metal line formed in the IMD layer; and
a redistribution layer formed over the IMD layer.

17. The method of claim 15, further comprising:
attaching the top package on the bottom package; and
applying a reflow process so that the top package is bonded on the bottom package to form a package-on-package structure.

18. The method of claim 15, further comprising:
providing a semiconductor wafer comprising a plurality of semiconductor dies;
depositing a protection layer on a front side of the semiconductor wafer;
thinning a backside of the semiconductor wafer until the semiconductor dies are exposed; and
sawing the semiconductor wafer to form the semiconductor die.

19. The method of claim 18, further comprising:
grinding the molding compound layer until the protection layer is removed.

20. The method of claim 15, further comprising:
after the step of attaching the plurality of metal bumps on the carrier through the adhesive layer, applying a pressure from a metal plate to the metal bumps until the metal bumps are partially pressed into the adhesive layer.

* * * * *